(12) United States Patent
Lee

(10) Patent No.: US 12,322,475 B2
(45) Date of Patent: Jun. 3, 2025

(54) SEMICONDUCTOR DEVICE WITH BURIED GATE WORD LINE DRIVERS

(71) Applicant: SK hynix Inc., Gyeonggi-do (KR)

(72) Inventor: Dong Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 261 days.

(21) Appl. No.: 17/844,552

(22) Filed: Jun. 20, 2022

(65) Prior Publication Data

US 2023/0005517 A1    Jan. 5, 2023

(30) Foreign Application Priority Data

Jun. 30, 2021 (KR) .......................... 10-2021-0085650

(51) Int. Cl.
| | |
|---|---|
| G11C 8/08 | (2006.01) |
| G11C 5/02 | (2006.01) |
| G11C 5/06 | (2006.01) |
| G11C 8/14 | (2006.01) |
| G11C 11/16 | (2006.01) |
| H10B 99/00 | (2023.01) |
| H10D 64/27 | (2025.01) |

(52) U.S. Cl.
CPC ................ *G11C 8/08* (2013.01); *G11C 5/025* (2013.01); *G11C 5/063* (2013.01); *G11C 8/14* (2013.01); *G11C 11/1657* (2013.01); *H10B 99/22* (2023.02); *H10D 64/519* (2025.01)

(58) Field of Classification Search
CPC .. G11C 8/08; G11C 5/025; G11C 8/14; G11C 11/1657; G11C 16/0483; H01L 29/4238; H01L 21/823828; H01L 27/092; H01L 27/105; H01L 21/82385; H10B 99/00; H10B 12/50

See application file for complete search history.

(56) References Cited

U.S. PATENT DOCUMENTS

| | | | |
|---|---|---|---|
| 8,212,293 B2 | 7/2012 | Kang | |
| 2009/0001482 A1* | 1/2009 | Kang | ................. H01L 29/4238 257/E27.06 |
| 2017/0178706 A1* | 6/2017 | Noguchi | ............. G11C 11/1695 |
| 2020/0091303 A1* | 3/2020 | Nam | ................. H01L 29/42368 |
| 2021/0057339 A1* | 2/2021 | Lee | ..................... H01L 23/5228 |
| 2022/0139443 A1* | 5/2022 | Kim | ....................... H10B 12/50 365/149 |

* cited by examiner

*Primary Examiner* — Donald H B Braswell
(74) *Attorney, Agent, or Firm* — IP & T GROUP LLP

(57) ABSTRACT

A semiconductor device includes a substrate; and a plurality of sub-word line drivers, each of the sub-word line drivers including a plurality of transistors, wherein at least one of the plurality of transistors has a buried gate structure positioned in the substrate.

18 Claims, 15 Drawing Sheets

FIG. 1

| CELL | SWD | CELL | | CELL | SWD | CELL |
|------|-----|------|--|------|-----|------|
| SA   |     | SA   | ...... | SA | | SA |
| CELL | SWD | CELL | | CELL | SWD | CELL |

⋮ ⋮

| CELL | SWD | CELL | | CELL | SWD | CELL |
|------|-----|------|--|------|-----|------|
| SA   |     | SA   | ...... | SA | | SA |
| CELL | SWD | CELL | | CELL | SWD | CELL |

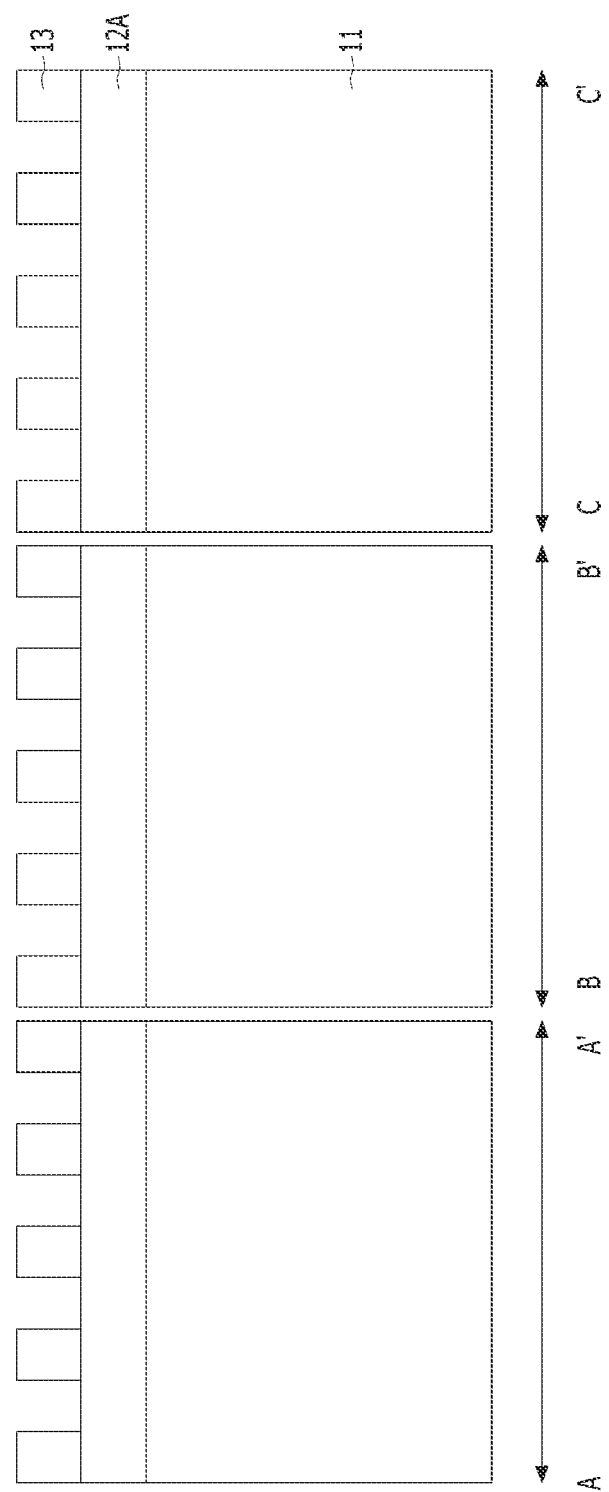

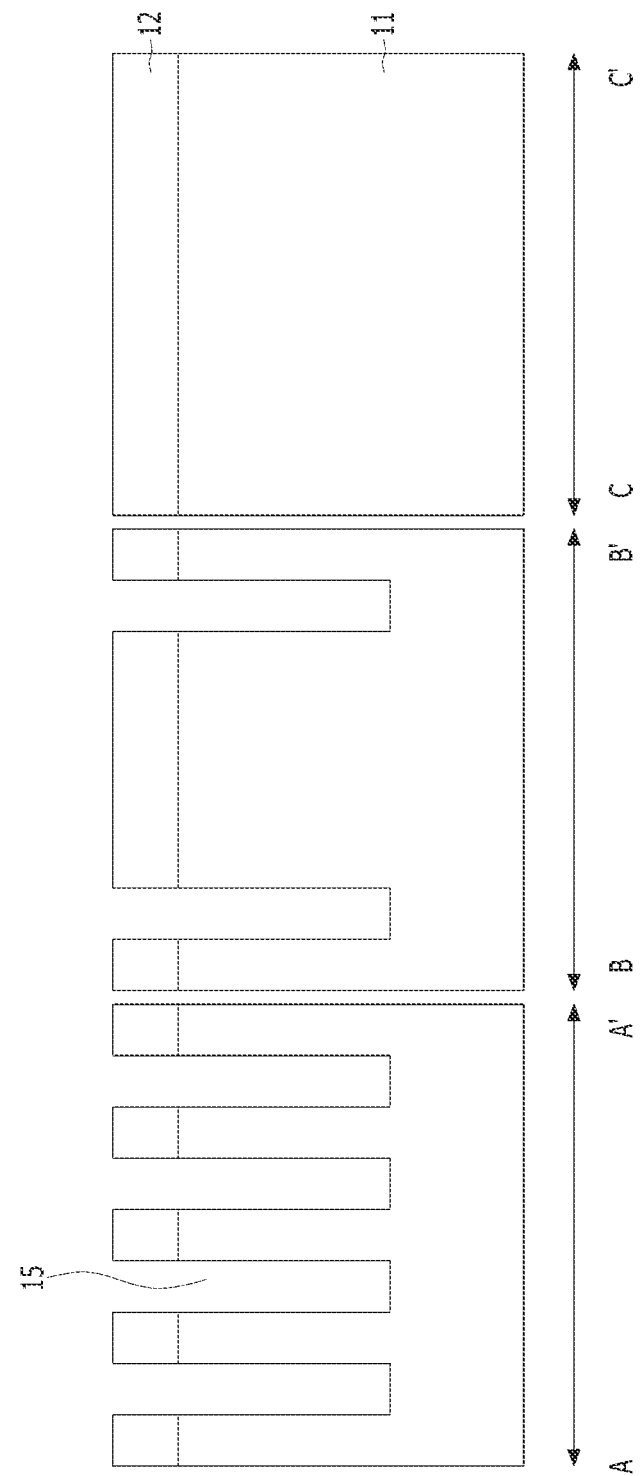

SEMICONDUCTOR DEVICE WITH BURIED GATE WORD LINE DRIVERS

CROSS-REFERENCE TO RELATED APPLICATIONS

The present application claims priority of Korean Patent Application No. 10-2021-0085650, filed on Jun. 30, 2021, which is incorporated herein by reference in its entirety.

BACKGROUND

1. Field

Various embodiments of the present invention relate generally to a semiconductor device and, more particularly, to a semiconductor device including a sub-word line driver region and a fabricating method thereof.

2. Description of the Related Art

Typically, a semiconductor device may be divided into a cell region including a plurality of memory cells and a peripheral circuit region for controlling the operation of the memory cells of the cell region. The peripheral circuit region may typically include a sense amplifier (SA) region and a sub-word line driver region.

As the size of semiconductor devices is reduced, the length of a gate channel of the peripheral circuit region is also reduced which may result in deteriorating transistor characteristics.

SUMMARY

Embodiments of the present invention are directed to a semiconductor device and a method for fabricating the semiconductor device. The semiconductor device is capable of securing the gate channel length in a sub-word line driver region In accordance with an embodiment of the present invention, a semiconductor device includes: a substrate; and a plurality of sub-word line drivers, each of the sub-word line drivers including a plurality of transistors, wherein at least one of the plurality of transistors has a buried gate structure positioned in the substrate.

In accordance with another embodiment of the present invention, a semiconductor device includes: a substrate including a cell region and a sub-word line driver region; a plurality of cell word lines extending along a first direction in the substrate of the cell region and spaced apart from each other along a second direction which is perpendicular to the first direction; and a plurality of main word lines extending along the first direction in the substrate of the sub-word line driver region and spaced apart from each other along the second direction, wherein each of the plurality of the main word lines constitutes a plurality of transistors, and at least one of the plurality of the transistors includes a buried gate structure positioned in the substrate.

In accordance with yet another embodiment of the present invention, a method for fabricating a semiconductor device includes: providing a substrate including a cell region and a sub-word line driver region; forming a plurality of line-type first mask patterns extending along a first direction and spaced apart from each other along a second direction which is perpendicular to the first direction over the substrate of the cell region and the sub-word line driver region; forming a second mask pattern partially covering the first mask pattern; forming a gate trench in the substrate by using the first and second mask patterns; and forming a buried gate structure that gap-fills the gate trench.

These and other features and advantages of the present invention will become understood by those with ordinary skill in the art of the invention from the following drawings and detailed description.

BRIEF DESCRIPTION OF THE DRAWINGS

FIG. 1 shows an arrangement relationship between a cell mat (CELL) region and a sub-word line driver (SWD) region.

FIGS. 6A to 6H are cross-sectional views illustrating a method for fabricating a semiconductor device in accordance with an embodiment of the present invention.

DETAILED DESCRIPTION

Figure 2A:
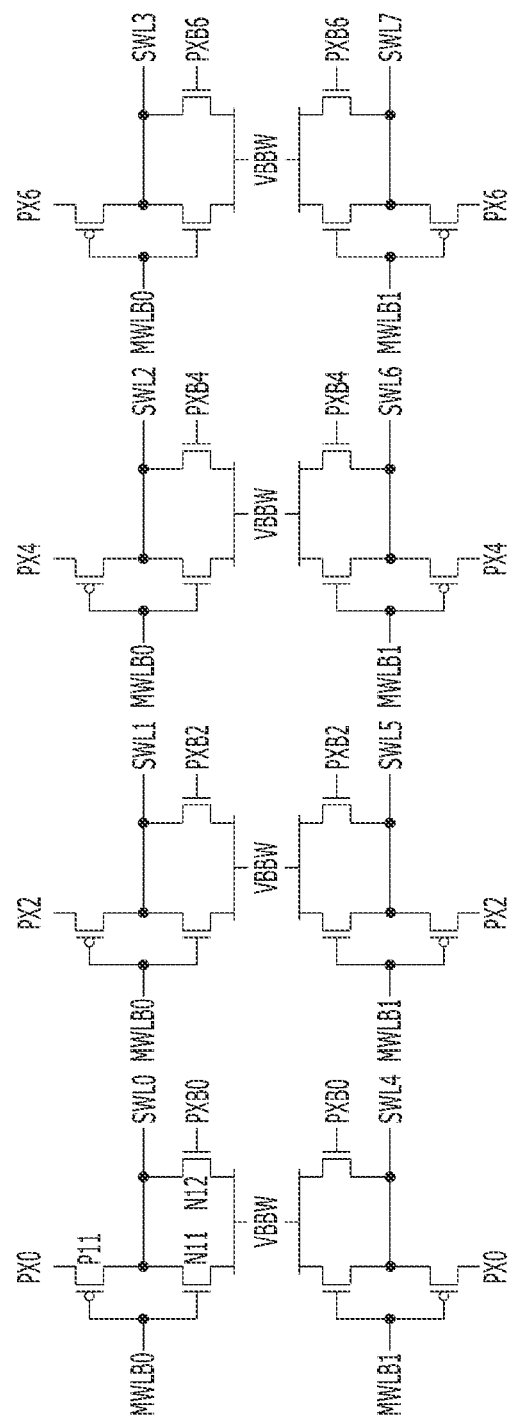
FIGS. 2A and 2B are circuit diagrams illustrating a structure of a general sub-word line driver.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, the various embodiments of the present invention will be described in detail with reference to the attached drawings.

FIG. 1 shows an arrangement relationship between a cell mat (CELL) region and a sub-word line driver (SWD) region.

Referring to FIG. 1, a plurality of cell mats CELL may be arranged in a vertical direction and a horizontal direction. Each cell mat CELL may include array-shaped memory cells for storing data.

A sub-word line driver SWD may be disposed between two neighboring cell mats CELL that are disposed adjacent to each other in the horizontal direction. The sub-word line driver SWD may drive a sub-word line in response to a signal which is input through a main word line (MWL) and an output signal of a word line enable driver (PXi Driver).

Each sub-word line driver SWD may operate the word lines (WL) of two neighboring cell mats CELL positioned on the left and right of the sub-word line driver SWD.

Also, a sense amplifier SA may be disposed between the two neighboring cell mats CELL that are disposed in the vertical direction. The sense amplifiers may serve to sense and amplify the data of a bit line in a corresponding cell array. In other words, the sense amplifier may sense and amplify the data of a selected memory cell.

Figure 2B:
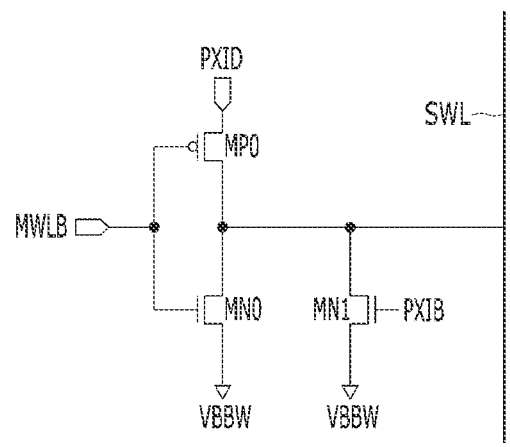

FIGS. 2A and 2B are circuit diagrams illustrating a structure of a general sub-word line driver.

Referring to FIG. 2A, the sub-word line driver may be formed in a sub-word line driver array which respectively outputs the sub-word line drive signals SWL0 to SWL3 and SWL4 to SWL7 in response to main word line drive signals MWLB0 and MWLB1 and word line selection signals PX0, PX2, PX4, and PX6. In this case, each sub-word line driver may have the same structure except for input and output signals.

Representatively, the structure of each sub-word line driver will be described with reference to FIG. 2B as follows.

The sub-word line driver may include a PMOS transistor MP0 and a first NMOS transistor MN0. Also, the sub-word line driver may include a second NMOS transistor MN1 that is coupled to a word line SWL.

The PMOS transistor MP0 functioning as a pull-up transistor may drive a corresponding word line in response to a main word line driving signal MWLB and a sub-word line driving signal PXID.

In the first NMOS transistor MN0 functioning as a pull-down transistor, a drain-source channel may be coupled between a back bias voltage VBBW (or a ground voltage VSS) and the drain of the PMOS transistor MP0. The main word line driving signal MWLB may be received at a gate of the first NMOS transistor MN0.

The second NMOS transistor MN1 function is for keeping a word line at a ground level when the word line is not selected. In the second NMOS transistor MN1 a drain-source channel may be coupled between a back bias voltage VBBW (or the ground voltage VSS) and the sub-word line SWL coupled to the drain of the PMOS transistor. An inverted sub-word line driving signal PXIB may be received at the gate of the second NMOS transistor MN1.

In FIG. 2B, the pull-up driver of the sub-word line driver SWD is formed of a PMOS transistor, but it may also be formed of an NMOS transistor depending on the type of the sub-word line driver SWD. The second NMOS transistor MN1 may serve to keep the sub-word line SWL at a ground level when a neighboring word line is enabled. When the second NMOS transistor MN1 is removed, the first NMOS transistor MN0 may partially function to keep the sub-word line SWL at the ground level.

FIG. 2B shows an example of a PMOS sub-word line driver. The sub-word line driver SWD may not be limited thereto and may also be realized as an NMOS sub-word line driver.

Figure 3:
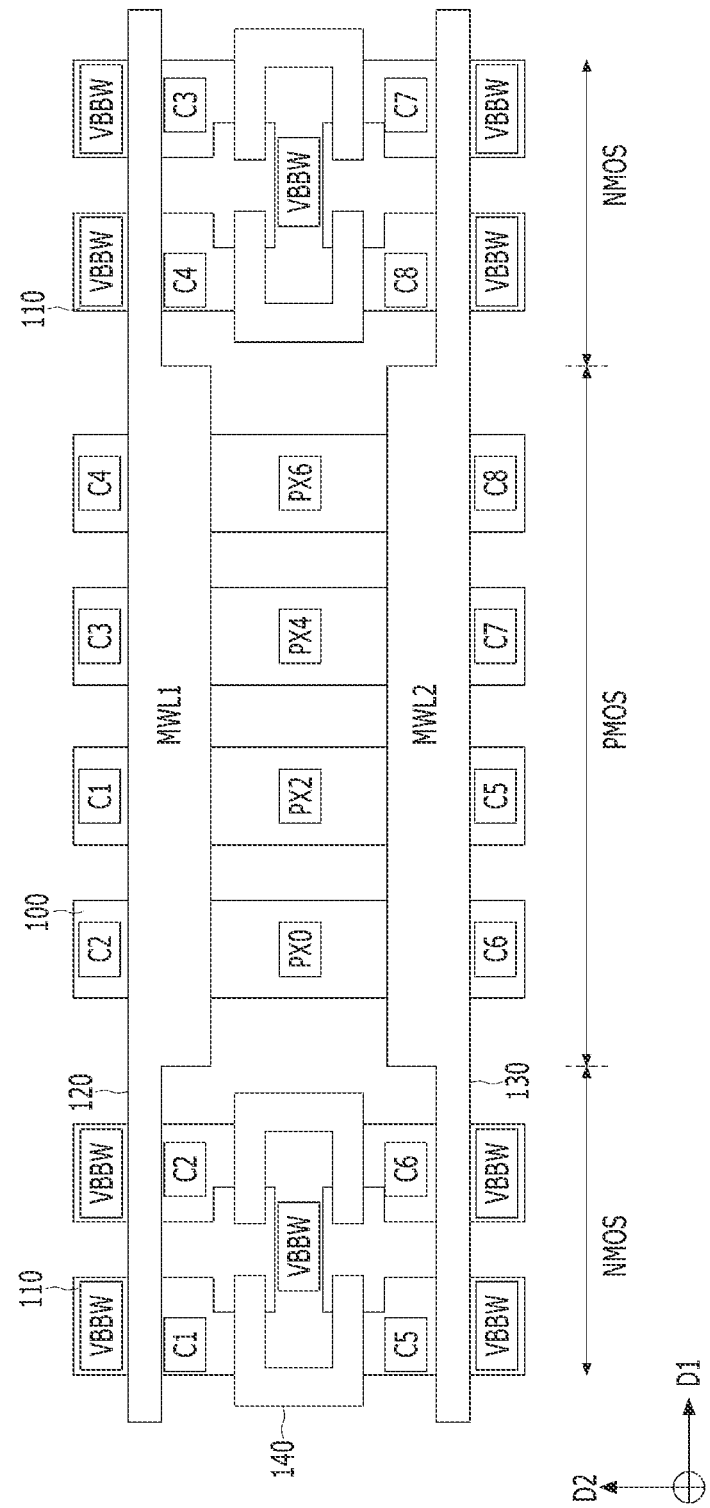
FIG. 3 is a layout diagram illustrating a sub-word line driver region in accordance with an embodiment of the present invention.

FIG. 3 is a layout diagram illustrating a sub-word line driver region in accordance with an embodiment of the present invention.

Referring to FIG. 3, the sub-word line driver may include a PMOS region and an NMOS region. Herein, the PMOS region may indicate a region in which a PMOS transistor is formed, and the NMOS region may indicate a region in which an NMOS transistor is formed. In other words, gates formed in the PMOS region may constitute PMOS transistors, and gates formed in the NMOS region may constitute NMOS transistors. A plurality of active regions 100 and 110 may be disposed in each of the PMOS region and the NMOS region, respectively. Two main word lines MWL1 and MWL2 may be passing through the active regions 100 and 110. The two main word lines MWL1 and MWL2 may include a gate line 120 and 130, respectively. The sub-word line driver may extend along a first direction D1 and may include the first and second gate lines 120 and 130 that are spaced apart from each other along a second direction D2 which is perpendicular to the first direction D1.

Also, on both sides of each of the first and second gate lines 120 and 130, first metal contacts C1 to C8 to be coupled to a sub-word line (SWL of FIG. 2B) and second metal contacts PX0, PX2, PX4, and PX6 for receiving a sub-word line driving signal (PXID of FIG. 2B) may be disposed.

In the PMOS region and the NMOS region, the same first metal contact among the first metal contacts C1 to C8 may be connected to the same sub-word line (SWL of FIG. 2B). For example, with referring to FIG. 2B, the first metal contact C1 may indicate a common node of the PMOS transistor MP0 and the first NMOS transistor MN0 connected to sub-word line SWL.

The active regions 100 of the PMOS region may extend along the second direction D2 and may be spaced apart from each other along the first direction D1. The active regions 100 of the PMOS region may have a bar shape.

The active regions 110 of the NMOS region may be formed in an 'H' shape. However, the technical concept and spirit of the present embodiment are not limited thereto.

In the PMOS region, first metal contacts C1 to C8 and second metal contacts PX0, PX2, PX4 and PX6 may be formed between the first gate line 120 and the second gate line 130. Among them, the second metal contacts PX0, PX2, PX4, and PX6 may be disposed in the middle of the active region 100 of the PMOS region. The second metal contacts PX0, PX2, PX4, and PX6 may be disposed between the first gate line 120 and the second gate line 130. The first metal contacts C1 to C8 may be spaced apart from the second metal contacts PX0, PX2, PX4, and PX6. Each one of the second metal contacts may be aligned with two of the first metal contacts in the second direction D2 and disposed between the two of the first metal contacts. For, example, the second metal contact PX6 is aligned with the C4 and C8 first metal contacts and disposed between the C4 and C8 first metal contacts. The second metal contact PX4 is aligned with the C3 and C7 first metal contacts and disposed between the C3 and C7 first metal contacts. The second metal contact PX2 is aligned with the C1 and C5 first metal contacts and disposed between the C1 and C5 first metal contacts. The second metal contact PX0 is aligned with the C2 and C6 first metal contacts and disposed between the C2 and C6 first metal contacts. The first and second gate lines 120 and 130 may be disposed between the first metal contacts C1 to C8 and the second metal contacts PX0, PX2, PX4, and PX6.

In the NMOS region, the metal contacts C1 to C8 and the back bias voltage VBBW (or the ground voltage VSS) may be disposed between the first gate line 120 and the second gate line 130. In the NMOS region, two second NMOS transistors 140 (NM1 in FIG. 2B) each having a 'C' shape may be added between the first gate line 120 and the second gate line 130. The two second NMOS transistors 140 may be disposed to be spaced apart from each other by a predetermined gap along the first direction D1. The two neighboring second NMOS transistors 140 may be disposed in a right-and-left symmetrical shape. Although this embodiment of the present invention shows the second NMOS transistors 140 each having a 'C' shape, the shape of the second NMOS transistors 140 is not limited thereto so long as it is a transistor suitable for PXIB, that is, a transistor of diverse shapes that may receive an inverted sub-word line driving signal PXIB, and capable of keeping a word line to the ground level when the word line is not selected. According to another embodiment of the present invention, the second NMOS transistors 140 may include an island-shaped transistor.

Figure 4:
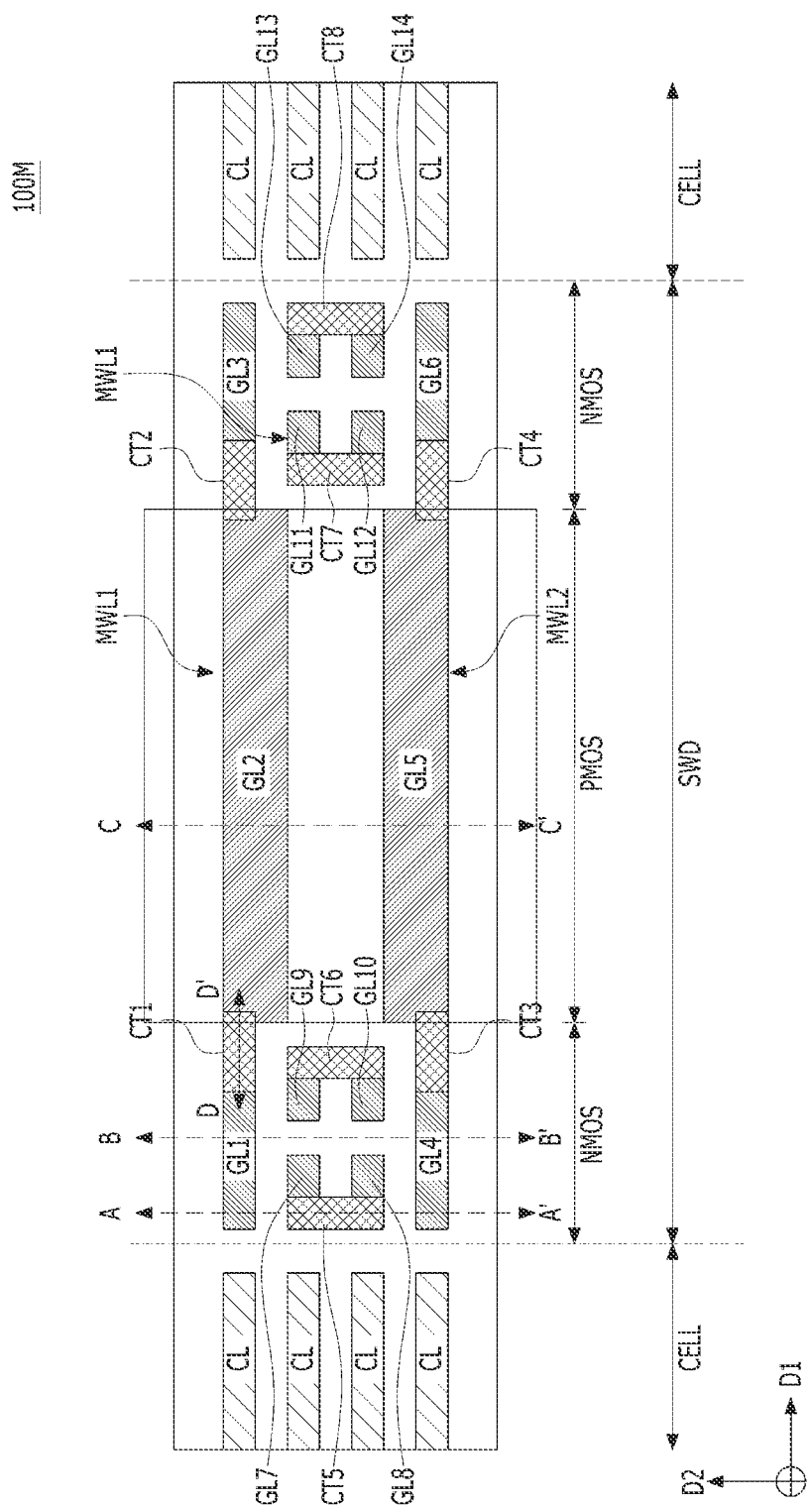
FIG. 4 is a plan view illustrating a semiconductor device in accordance with an embodiment of the present invention.

FIG. 4 is a plan view illustrating a semiconductor device 100M in accordance with an embodiment of the present invention.

Referring to FIG. 4, the semiconductor device 100M may include cell regions CELL and a sub-word line driver region SWD which is disposed between the neighboring cell regions CELL. The sub-word line driver region SWD may include a PMOS region and NMOS region. In the embodiment of the present invention, the PMOS region disposed between two neighboring NMOS regions. Herein, the PMOS region may be a region in which a PMOS transistor is formed, and the NMOS region may be a region in which an NMOS transistor is formed. In other words, in the PMOS region, a PMOS gate constituting the PMOS transistor is formed, and in the NMOS region, a NMOS gate constituting the NMOS transistor is formed.

A cell word line CL may be formed in the cell region CELL. The cell word line CL may include a buried gate structure. The cell word line CL may be formed in a line type extending along the first direction D1. A plurality of neighboring cell word lines CL may be disposed to be spaced apart from each other along the second direction D2 which is perpendicular to the first direction D1.

The sub-word line driver region SWD may include a first main word line MWL1 and a second main word line MWL2 that extend along the first direction D1. The first and second main word lines MWL1 and MWL2 may be disposed to be spaced apart from each other along the second direction D2. In this embodiment of the present invention, a sub-word line driver region SWD including the first and second main word lines MWL1 and MWL2 is illustrated, but the present invention is not limited thereto.

The first main word line MWL1 according to the embodiment of the present invention may include first to third gate lines GL1, GL2, and GL3. The first to third gate lines GL1, GL2, and GL3 may constitute a plurality of transistors that are coupled to a plurality of active regions (see FIG. 3). The active regions (refer to FIG. 3) may be isolated and defined by an isolation region.

The first and third gate lines GL1 and GL3 disposed in the NMOS region may constitute a first NMOS transistor, respectively. The second gate line GL2 disposed in the PMOS region may constitute a PMOS transistor. The first to third gate lines GL1, GL2, and GL3 may be electrically connected to each other. The first to third gate lines GL1, GL2, and GL3 may extend along the first direction D1 in the sub-word line driver region SWD.

A plurality of transistors formed by the first to third gate lines GL1, GL2, and GL3 may be formed to have different line widths. The transistors formed the first to third gate lines GL1, GL2, and GL3 may include gate structures of different structures. According to another embodiment of the present invention, the transistors formed the first to third gate lines GL1, GL2, and GL3 may include gate structures having the same line width and the same structure.

For example, each of the first NMOS transistors may include a buried gate structure. The buried gate structure may include a buried gate structure formed in a substrate, in other words, the upper surface of the buried gate structure may be positioned at the same level as the upper surface of the substrate and the lower surface of the buried gate structure may be positioned at a lower level than the upper surface of the substrate. The PMOS transistor may include a planar gate structure which is formed over the substrate. According to another embodiment of the present invention, all of the first to third gate lines GL1, GL2, and GL3 may include gate structures having the same structure. For example, all of the first to third gate lines GL1, GL2, and GL3 may include a buried gate structure. According to yet another embodiment of the present invention, all of the first to third gate lines GL1, GL2, and GL3 may include a planar gate structure. When the first to third gate lines GL1, GL2, and GL3 include gate structures of the same structure, the first to third gate lines GL1, GL2, and GL3 may be a single gate line that extends along the first direction D1.

When the first gate line GL1 and the second gate line GL2 include gate structures of different structures, a contact for coupling the first gate line GL1 and the second gate line GL2 may be further included. According to the embodiment of the present invention, a first contact CT1 may be applied to couple the first gate line GL1 and the second gate line GL2, and a detailed structure thereof will be described later. When the second gate line GL2 and the third gate line GL3 include gate structures of different structures, a contact for coupling the second gate line GL2 and the third gate line GL3 may be further included. According to the embodiment of the present invention, a second contact CT2 may be applied to couple the second gate line GL2 and the third gate line GL3.

The second main word line MWL2 in accordance with the embodiment of the present invention may include fourth to sixth gate lines GL4, GL5, and GL6. The second main word line MWL2 may have the same structure as that of the first main word line MWL1. The second main word line MWL2 may be disposed to be spaced apart from the first main word line MWL1 along the second direction D2. The fourth to sixth gate lines GL4, GL5, and GL6 may constitute a plurality of transistors that are coupled to a plurality of active regions (see FIG. 3). A plurality of active regions (see FIG. 3) may be isolated and defined by an isolation region (not shown).

The fourth and sixth gate lines GL4 and GL6 disposed in the NMOS region may constitute a first NMOS transistor. The fifth gate line GL5 disposed in the PMOS region may constitute a PMOS transistor. The fourth to sixth gate lines GL4, GL5, and GL6 may be electrically connected to each other. The fourth to sixth gate lines GL4, GL5, and GL6 may extend along the first direction D1 in the sub-word line driver region SWD.

The transistors formed by the fourth to sixth gate lines GL4, GL5, and GL6 may be formed to have different line widths. The transistors forming the fourth to sixth gate lines GL4, GL5, and GL6 may include gate structures having different structures. According to another embodiment of the present invention, the transistors forming the fourth to sixth gate lines GL4, GL5, and GL6 may include a gate structure having the same structure and having the same line width.

For example, the fourth and sixth gate lines GL4 and GL6 may constitute a first NMOS transistor of a buried gate structure. The buried gate structure may include a buried gate structure that is formed in a substrate, in other words, the upper surface of the buried gate structure may be positioned at the same level as the upper surface of the substrate and the lower surface of the buried gate structure may be positioned at a lower level than the upper surface of the substrate. The fifth gate line GL5 may constitute a PMOS transistor of a planar gate structure which is formed over the substrate. According to another embodiment of the present invention, all of the fourth to sixth gate lines GL4, GL5, and GL6 may include gate structures of the same structure. For example, the fourth to sixth gate lines GL4, GL5, and GL6 may include a buried gate structure. According to yet another embodiment of the present invention, all of the fourth to sixth gate lines GL4, GL5, and GL6 may include a planar gate structure. When the fourth to sixth gate lines GL4, GL5, and GL6 include gate structures of the same structure, the fourth to sixth gate lines GL4, GL5, and GL6 may be a single gate line that extends along the first direction D1.

When the fourth gate line GL4 and the fifth gate line GL5 include gate structures of different structures, a contact for coupling the fourth gate line GL4 and the fifth gate line GL5 may be further included. According to the embodiment of the present invention, a third contact CT3 may be applied to couple the fourth gate line GL4 and the fifth gate line GL5. When the fifth gate line GL5 and the sixth gate line GL6 include gate structures of different structures, a contact for coupling the fifth gate line GL5 and the sixth gate line GL6 may be further included. According to the embodiment of the present invention, the fourth contact CT4 may be applied to couple the fifth gate line GL5 and the sixth gate line GL6.

Seventh to fourteenth gate lines GL7 to GL14 for receiving an inverted sub-word line driving signal PXIB may be disposed between the first main word line MWL1 and the second main word line MWL2. All of the seventh to fourteenth gate lines GL7 to GL14 may include gate structures of the same structure. For example, the seventh to fourteenth gate lines GL7 to GL14 may constitute second NMOS transistors of a buried gate structure. The buried gate structure may include a buried gate structure which is formed in the substrate, that is, the upper surface of the buried gate structure may be positioned at the same level as the upper surface of a substrate and the lower surface of the buried gate structure may be positioned at a lower level than the upper surface of the substrate.

The gate lines neighboring in the up and down direction (i.e., the second direction D2) may be coupled to each other by a contact to operate as one transistor. For example, the seventh gate line GL7 and the eighth gate line GL8 may be coupled by a fifth contact CT5. The ninth gate line GL9 and the $10^{th}$ gate line GL10 may be coupled by a sixth contact CT6. The $11^{th}$ gate line GL11 and the $12^{th}$ gate line GL12 may be coupled by a seventh contact CT7. The $13^{th}$ gate line GL13 and the $14^{th}$ gate line GL14 may be coupled by an eighth contact CT8. All of the seventh to $14^{th}$ gate lines GL7 to GL14 may include gate structures of the same structure.

According to another embodiment of the present invention, the second NMOS transistors formed by the seventh to $14^{th}$ gate lines GL7 to GL14 may include a 'C'-shaped planar gate structure. They may include a 'C'-shaped planar gate structure or an island-shaped planar gate structure. However, the concept and spirit of the embodiment of the present invention are not limited thereto and may include all possible types of gate structures.

In the sub-word line driver region SWD of the embodiment of the present invention, among the transistors formed by the gate line, the transistors including a buried gate structure may be formed through the same mask process as that of a cell word line CL of the cell region CELL. In other words, a patterned mask may be formed to extend from the cell word line CL to the sub-word line driver region SWD to form a buried gate structure. Thus, a separate mask process for forming the buried gate structure in the sub-word line driver region may be omitted. Furthermore, by forming some or all of the transistors as buried gate structures, it may be possible to integrate a semiconductor device. Also, the reliability of the semiconductor device may be secured by increasing the channel length of a transistor.

Among the transistors formed by the gate line in the sub-word line driver region SWD, transistors including the planar gate structure may be formed through a separate mask process. For example, in the embodiment of the present invention, the line widths of the second and fifth gate lines GL2 and GL5 disposed in the PMOS region may be greater than the line widths of the other gate lines, but the present invention is not limited thereto. The line widths of the second and fifth gate lines GL2 and GL5 may be defined through a separate mask process from the mask process for the other gate lines. The second and fifth gate lines GL2 and GL5 may include a planar gate structure.

Figure 5A:
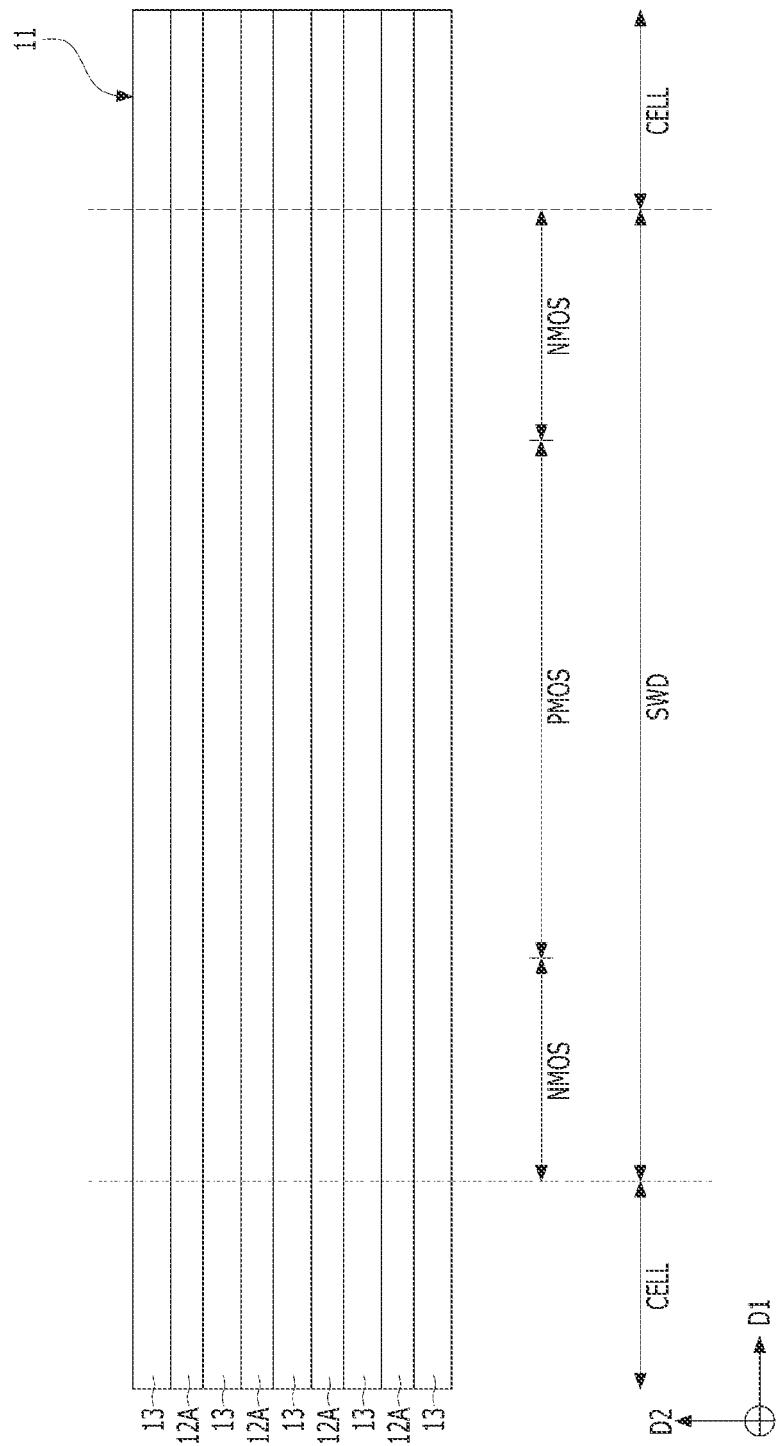
FIGS. 5A and 5B are plan views illustrating a method of forming a buried gate trench in accordance with an embodiment of the present invention.
Figure 5B:
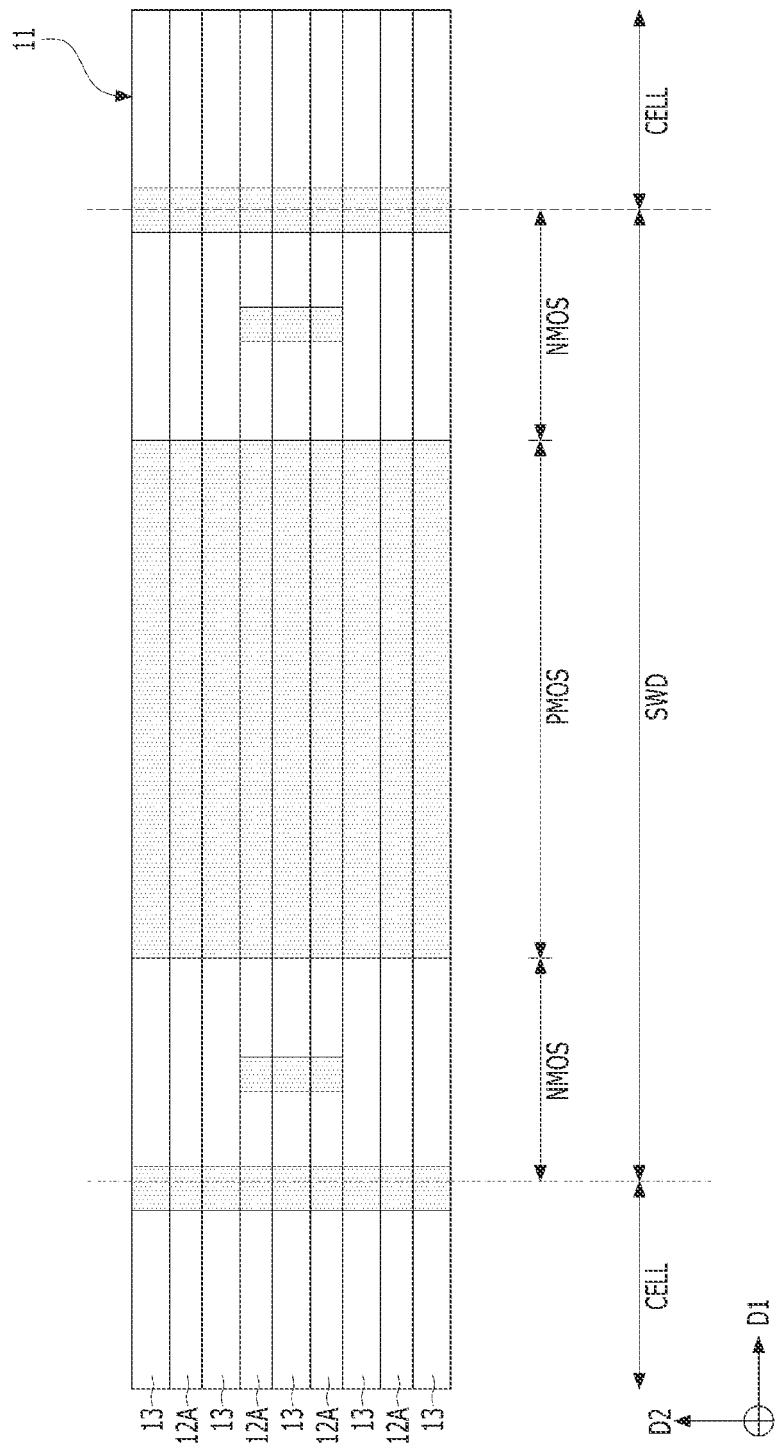

FIGS. 5A and 5B are plan views illustrating a method of forming a buried gate trench in accordance with an embodiment of the present invention.

Referring to FIG. 5A, a substrate 11 may include a sub-word line driver region SWD disposed between two neighboring cell regions CELL. An etch target layer 12A may be formed over the substrate 11, and a first mask pattern 13 may be formed over the etch target layer 12A. The etch target layer 12A may serve as an etch barrier for the subsequent etching process of the substrate 11. The etch target layer 12A may include a material having an etch selectivity with respect to the substrate 11 and the first mask pattern 13.

The first mask pattern 13 may serve as an etch barrier for etching the etch target layer 12A. The first mask pattern 13 may include a material having an etch selectivity with respect to the etch target layer 12A. The first mask pattern 13 may extend from the cell region CELL to the sub-word line driver region SWD. The first mask pattern 13 may include a plurality of line patterns extending along the first direction D1 and spaced apart from each other along the second direction D2 which is perpendicular to the first direction D1.

The first mask pattern 13 may be a mask pattern for forming a cell word line. The first mask pattern 13 may be formed by a double patterning process, but the concept and spirit of the present invention is not limited thereto.

Referring to FIG. 5B, a second mask pattern 14 may be formed. The second mask pattern 14 may selectively cover the first mask pattern 13 and the etch target layer 12A. The second mask pattern 14 may selectively cover a region where a buried gate structure is not to be formed. The second mask pattern 14 may cover the boundary between the cell region CELL and the sub-word line driver region SWD. The second mask pattern 14 may cover all of the PMOS region. The second mask pattern 14 may cover a portion of the NMOS region.

The second mask pattern 14 may be used for forming the gate structure in accordance with the embodiment of the present invention of FIG. 4, and the area covered by the second mask pattern 14 may vary depending on the area to which the buried gate structure is applied.

FIGS. 6A to 6H are cross-sectional views illustrating a method for fabricating a semiconductor device in accordance with an embodiment of the present invention. FIGS. 6A to 6H illustrate a method for fabricating the semiconductor device shown in FIG. 4. The cross-sectional views of FIGS. 6A and 6B may correspond to the plan views of FIGS. 5A and 5B. Lines A-A', B-B', C-C', and D-D' shown in FIGS. 6A to 6H may show the cross-sectional views according to the lines A-A', B-B', C-C', and D-D' shown in FIG. 4.

Referring to FIG. 6A, an etch target layer 12A may be formed over the substrate 11. The substrate 11 may include a semiconductor substrate, such as a silicon substrate. The substrate 11 may be formed of a silicon-containing material. The substrate 11 may include diverse doping structures according to the design requirements. The substrate 11 may include germanium, silicon carbide (SiC), silicon germanium (SiGe), or other semiconductors, such as diamond. The substrate 11 may include a compound semiconductor and/or an alloy semiconductor. The substrate 11 may include a III-V group semiconductor substrate. The substrate 11 may include a compound semiconductor substrate, such as GaAs, InAs, or InP. The substrate 11 may include a Silicon-On-Insulator (SOI) substrate. The substrate 11 may include a conductive region, for example, a well and channel doped with an impurity, or a structure doped with an impurity.

The etch target layer 12A may serve as an etch barrier for etching the substrate 11. The etch target layer 12A may include a material having an etch selectivity with respect to the substrate 11.

Subsequently, a first mask pattern 13 may be formed over the etch target layer 12A. The first mask pattern 13 may open a gate trench region. The first mask pattern 13 may serve as an etch barrier for patterning the etch target layer 12A. The first mask pattern 13 may include a material having an etch selectivity with respect to the etch target layer 12A. The first mask pattern 13 may be formed by a double patterning process, but the concept and spirit of the embodiment of the present invention are not limited thereto. The first mask pattern 13 may be formed of a plurality of line patterns that extend along the first direction D1 and are spaced apart from each other by a predetermined gap along the second direction D2 as illustrated in the plan view of FIG. 5A. In particular, the first mask pattern 13 of the embodiment of the present invention may be a mask pattern for forming a cell word line in the cell region.

Figure 6B:
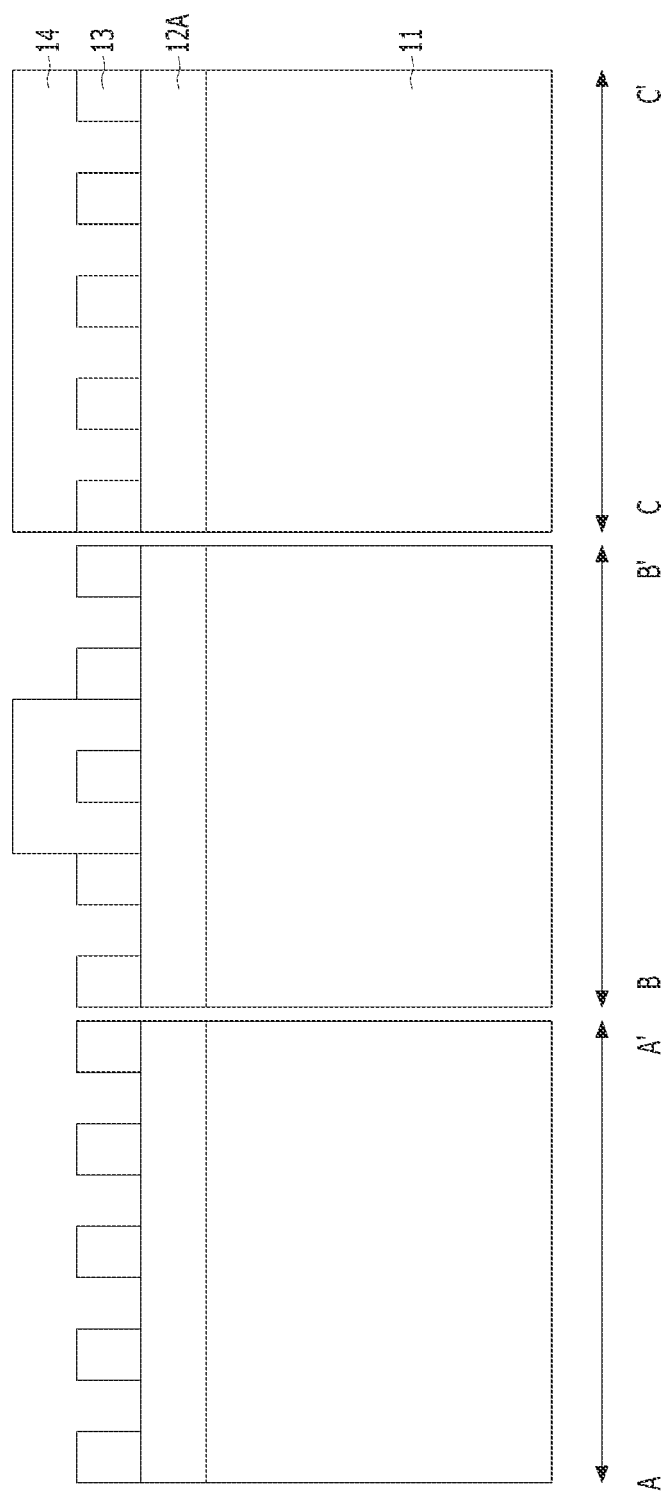
Figure 6C:
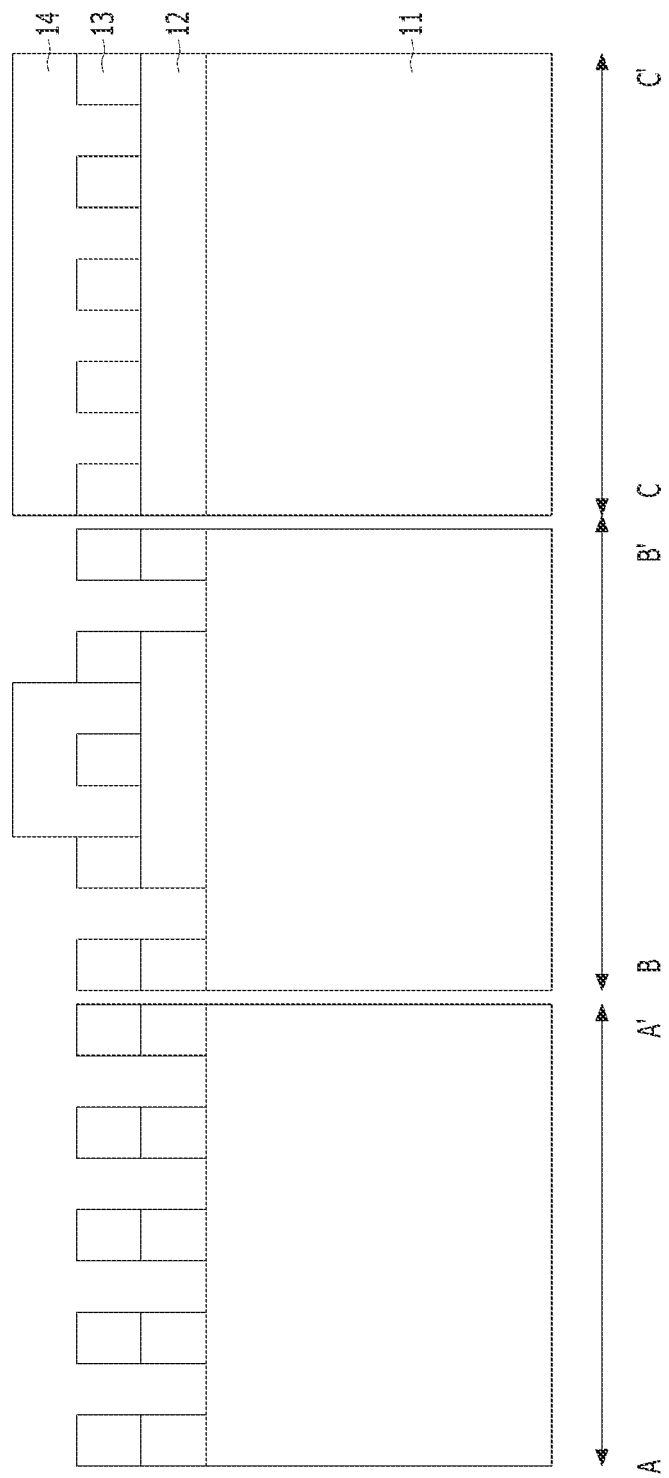

Referring to FIGS. 6B and 6C, the second mask pattern 14 may be formed over the first mask pattern 13. The second mask pattern 14 may cover the first mask pattern 13 and the etch target layer 12A in a region where the gate trench is not formed. The second mask pattern 14 may include a material having an etch selectivity with respect to the first mask pattern 13. The second mask pattern 14 may cover, for example, a photoresist. As illustrated in the plan view of FIG. 5B, the second mask pattern 14 of the embodiment of the present invention may cover all of the PMOS region and a portion of the NMOS region.

Subsequently, the etch target layer 12A may be etched to form a hard mask 12. The hard mask 12 may be formed in a line type that opens the gate trench region.

Figure 6D:
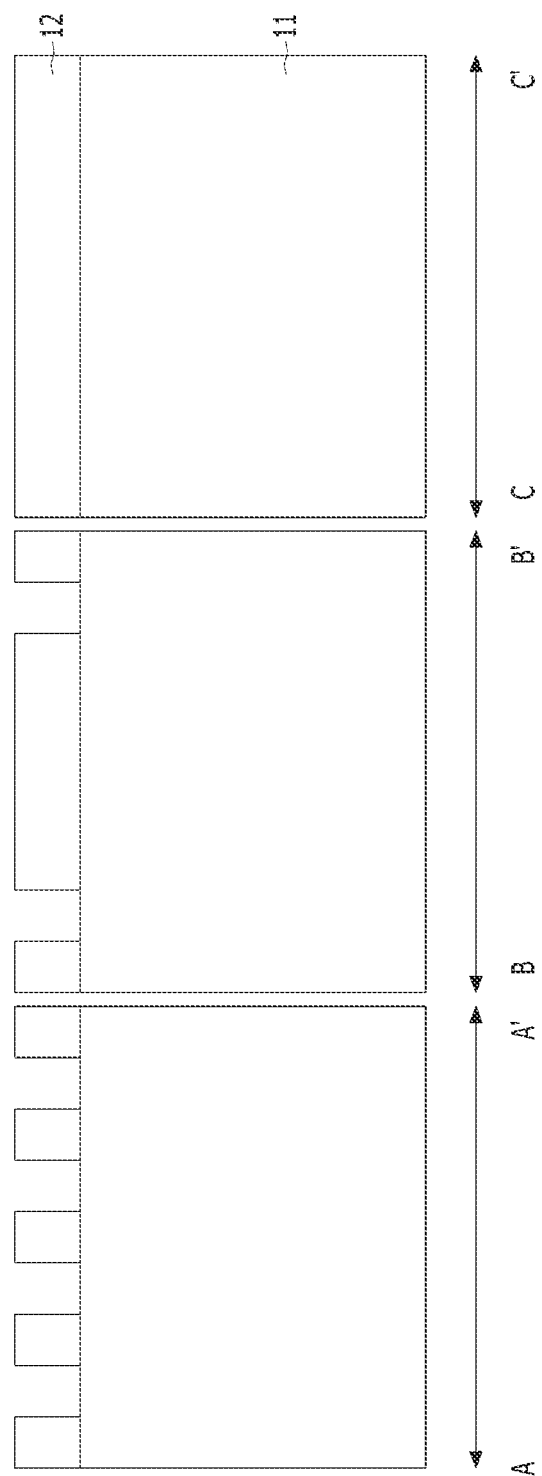

Referring to FIGS. 6D and 6E, the first and second mask patterns 13 and 14 may be removed.

Subsequently, the gate trench 15 may be formed by etching the substrate 11 by using the hard mask 12 as an etch barrier. The gate trench 15 of the embodiment of the present invention may be selectively formed only in the NMOS region. The gate trench 15 may be formed by using a mask having the same line width as the line width of the cell word line CL shown in FIG. 4. The gate trench 15 may have a line width similar to the line width of the cell word line CL shown in FIG. 4. The gate trench 15 may be etched to a sufficient depth so as to have a channel length capable of improving the gate characteristics.

Figure 6F:
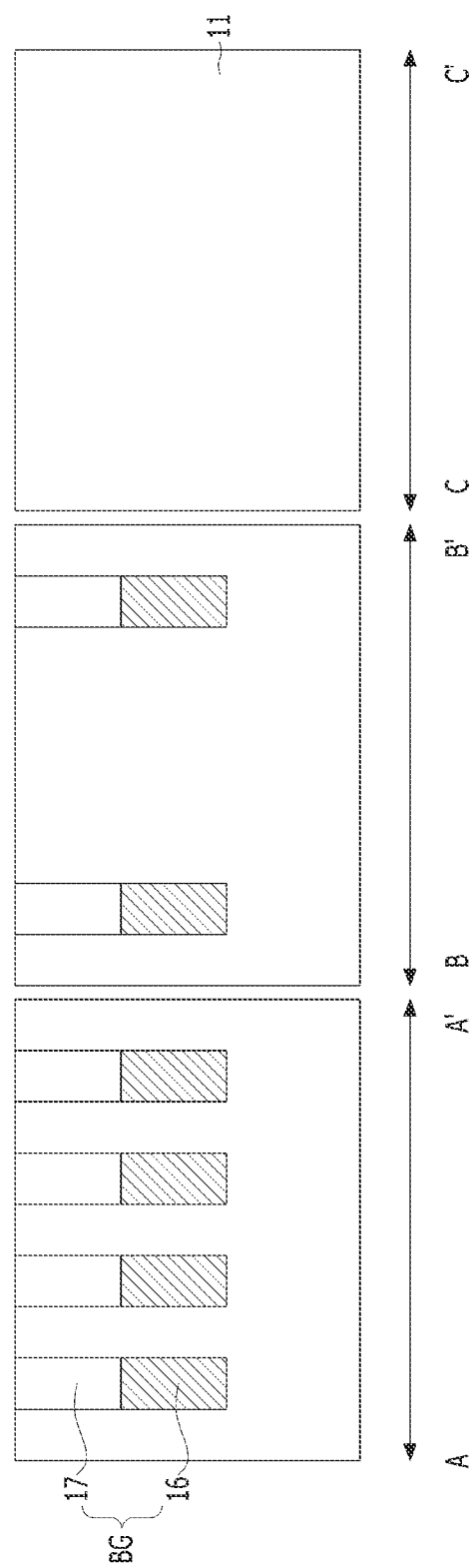

Referring to FIG. 6F, a buried gate structure BG may be formed to gap-fill the gate trench 15. The buried gate structure BG may include a first gate electrode 16 filling a lower part of the gate trench and a capping layer 17 that caps an upper portion of the first gate electrode 16. A first gate dielectric layer (not shown) may be formed at the interface between the gate electrode 16 and the capping layer 17 and the gate trench 15.

The gate electrode 16 may include a conductive material. The gate electrode 16 of the embodiment of the present invention may include a conductive material appropriate for an NMOS transistor. The capping layer 17 may include a dielectric material. The capping layer 17 may include, for example, silicon nitride.

Figure 6G:
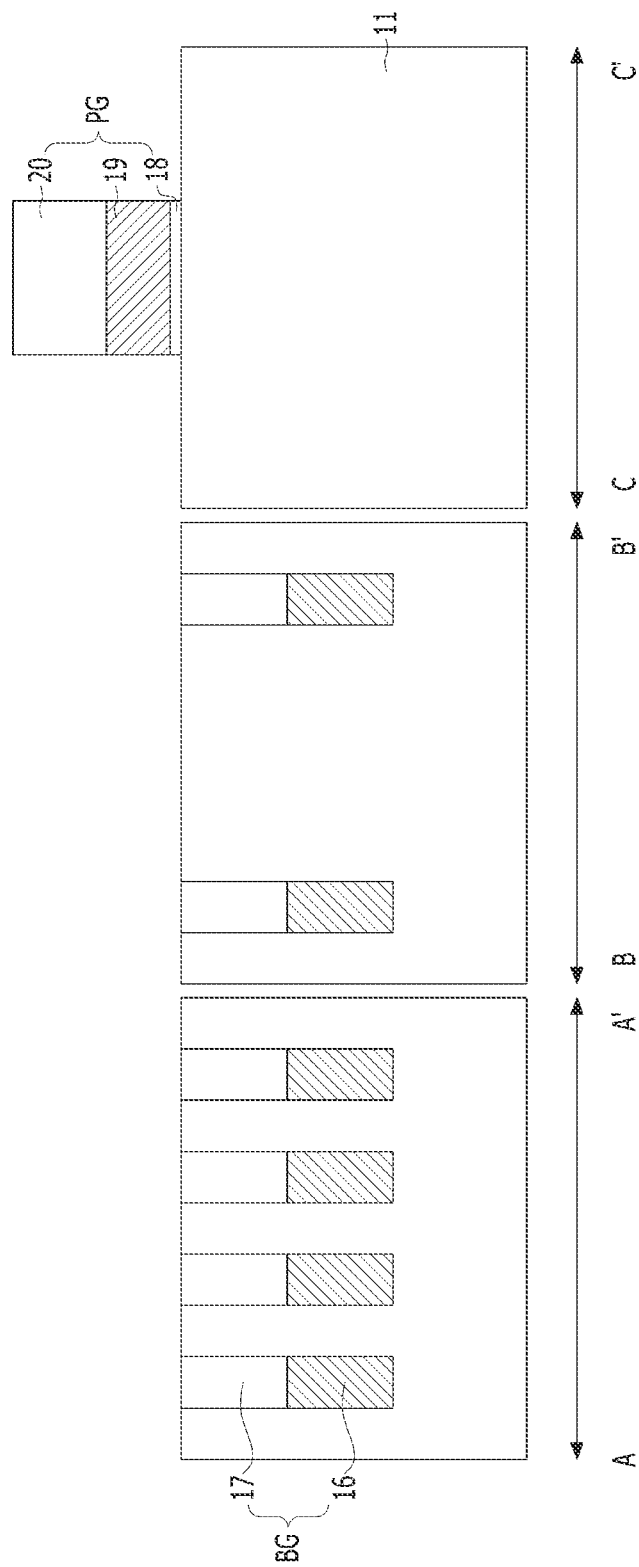

Referring to FIG. 6G, a planar gate structure PG may be formed over the substrate 11 of the PMOS region. The planar gate structure PG may include a stacked structure of a second gate dielectric layer 18, a second gate electrode 19, and a gate hard mask 20. The second gate electrode 19 may include a conductive material. The second gate electrode 19 of the embodiment of the present invention may include a conductive material appropriate for a PMOS transistor.

As described above, according to the embodiment of the present invention, the mask pattern for forming a cell word line of the cell region may extend to the sub-word line driver region and may be used as a mask for forming a transistor of the sub-word line driver region. In this way, a separate mask process may be omitted so as to simplify the fabrication process. Also, semiconductors may be integrated by applying the buried gate structure to the sub-word line driver region and, at the same time, the reliability of the semiconductor may be improved by increasing the channel length of a transistor.

Figure 6H:
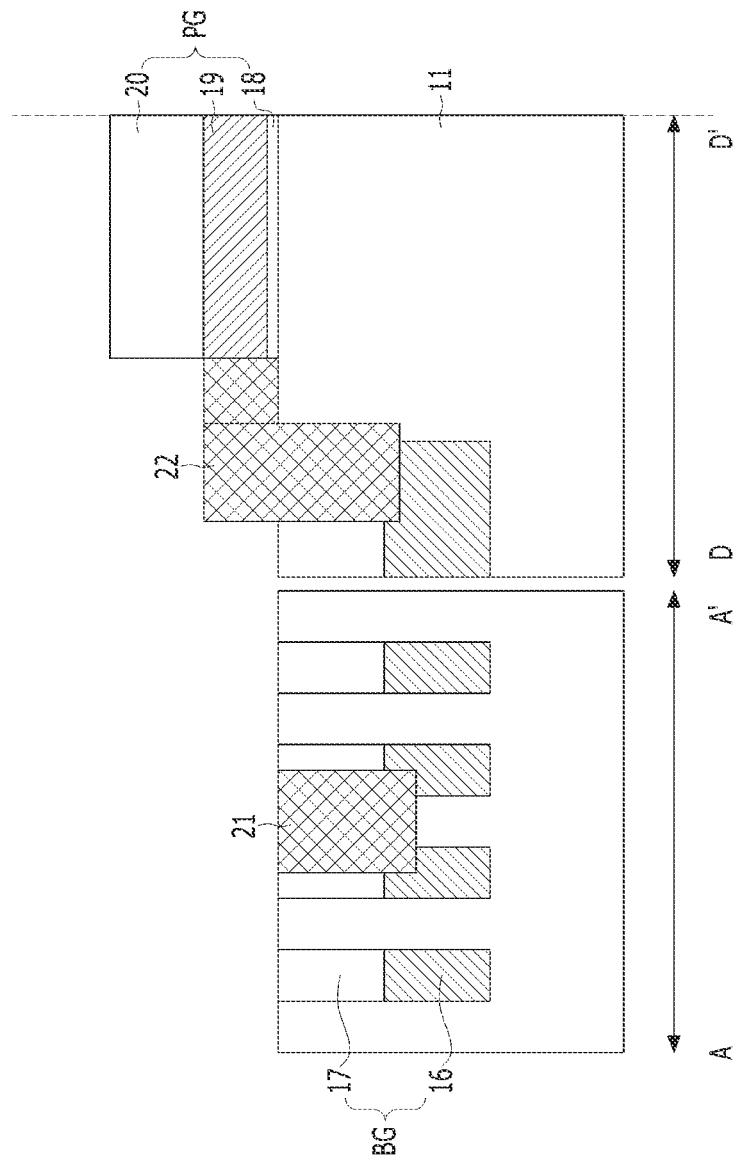

Referring to FIG. 6H, a first contact 21 for coupling buried gate structures BG to each other and a second contact 22 for coupling the buried gate structure BG and the planar gate structure PG to each other may be formed.

The first contact 21 may represent contacts CT5 to CT8 for coupling the vertically neighboring gate lines when the seventh to 14$^{th}$ gate lines of FIG. 4 are formed of a buried gate structure. The upper surface of the first contact 21 may be positioned at the same level as the upper surface of the substrate 11. A lower surface of the first contact 21 may contact the first gate electrodes 16 of the buried gate structure BG. In other words, the lower surface of the first contact 21 may be positioned at the same level as the upper surface of the first gate electrodes 16 or may be positioned at a lower level than the upper surface of the first gate electrodes 16.

The second contact 22 may represent the case where the first to sixth gate lines GL1 to GL6 forming the first and second main word lines MWL1 and MWL2 in FIG. 4 are formed of gate structures having different structures. In other words, the second contact 22 may represent the contacts CT1 to CT4 for coupling a buried gate structure and a planar gate structure.

According to the embodiment of the present invention, there may be an effect of improving the reliability of a semiconductor device by increasing the channel length of a gate by applying a buried gate to a sub-word line driver.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a substrate; and
   a plurality of sub-word line drivers, each of the sub-word line drivers including a plurality of transistors, wherein at least one of the plurality of the transistors has a buried gate structure positioned in the substrate, wherein the transistors include:

a NMOS transistor having a buried gate structure; and a PMOS transistor having a planar gate structure formed over the substrate.

2. The semiconductor device of claim 1, wherein an upper surface of the buried gate structure is positioned at the same level as an upper surface of the substrate.

3. The semiconductor device of claim 1, wherein a lower surface of the buried gate structure is positioned at a lower level than an upper surface of the substrate.

4. The semiconductor device of claim 1, wherein the plurality of the transistors include:

a PMOS transistor and first and second NMOS transistors.

5. The semiconductor device of claim 1, wherein a line width of the PMOS transistor is greater than a line width of the first NMOS transistor.

6. The semiconductor device of claim 1, wherein the first NMOS transistor and the PMOS transistor are electrically connected through a contact.

7. The semiconductor device of claim 1, wherein a line width of the PMOS transistor is greater than a line width of the NMOS transistor.

8. The semiconductor device of claim 1, wherein the NMOS transistor and the PMOS transistor are electrically connected through a contact.

9. A semiconductor device, comprising:

a substrate including a cell region and a sub-word line driver region;

a plurality of cell word lines extending along a first direction in the substrate of the cell region and spaced apart from each other along a second direction which is perpendicular to the first direction; and a plurality of main word lines extending along the first direction in the substrate of the sub-word line driver region and spaced apart from each other along the second direction, wherein each of the plurality of the main word lines constitutes a plurality of transistors, and at least one of the plurality of the transistors includes a buried gate structure positioned in the substrate, wherein the transistors include:

a first NMOS transistor having a buried gate structure; and a PMOS transistor having a planar gate structure formed over the substrate.

10. The semiconductor device of claim 9, wherein an upper surface of the buried gate structure is positioned at the same level as an upper surface of the substrate.

11. The semiconductor device of claim 9, wherein a lower surface of the buried gate structure is positioned at a lower level than an upper surface of the substrate.

12. The semiconductor device of claim 9, wherein the transistors constituted by each of the main word lines are arranged side by side along a first direction and electrically connected to each other.

13. The semiconductor device of claim 9, further comprising:

a second NMOS transistor between the main word lines that are positioned adjacent to each other along a second direction.

14. The semiconductor device of claim 13, wherein the second NMOS transistor includes a 'C'-shaped buried gate structure.

15. The semiconductor device of claim 13, wherein the second NMOS transistor includes an island-shaped planar gate structure.

16. The semiconductor device of claim 9, wherein the cell region and the sub-word line driver region are positioned adjacent to each other along the first direction.

17. The semiconductor device of claim 9, wherein the sub-word line driver region is positioned between the neighboring cell regions.

18. The semiconductor device of claim 9, wherein the cell word line includes a buried gate structure.

* * * * *